United States Patent
Chen et al.

(10) Patent No.: US 7,209,406 B2
(45) Date of Patent: Apr. 24, 2007

(54) MEMORY DEVICE WITH RAPID WORD LINE SWITCH

(75) Inventors: Chi-Ming Chen, Hsinchu (TW); Chang-Ting Chen, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 162 days.

(21) Appl. No.: 11/132,635

(22) Filed: May 19, 2005

(65) Prior Publication Data

US 2006/0262634 A1 Nov. 23, 2006

(51) Int. Cl.
*G11C 8/00* (2006.01)
(52) U.S. Cl. ............... 365/230.06; 365/230.03; 365/200
(58) Field of Classification Search ......... 365/230.06, 365/230.03, 200
See application file for complete search history.

(56) References Cited

U.S. PATENT DOCUMENTS

| | | | |
|---|---|---|---|
| 6,650,568 B2 * | 11/2003 | Iijima | 365/185.18 |
| 7,006,397 B2 * | 2/2006 | Toda | 365/205 |
| 2003/0210583 A1 | 11/2003 | Yiu et al. | |
| 2004/0003195 A1 | 1/2004 | Takahashi et al. | |

* cited by examiner

*Primary Examiner*—Richard T. Elms
*Assistant Examiner*—Pho M. Luu
(74) *Attorney, Agent, or Firm*—Mark Haynes; Haynes Beffel & Wolfeld LLP (57) ABSTRACT

A memory device includes an array of storage cells, multiple words lines, where each word line corresponds to a row in the array of storage cells, and multiple bit lines, where each bit line corresponds to a column in the array of storage cells. The device further includes a row decoder attached to the multiple word lines. The row decoder is operable to assert and to de-assert individual word lines. Each of the word lines has a head portion adjacent to where the word line is attached to the row decoder. The memory device supports a column decode sequence for accessing multiple storage cells within a row of the array. The column decode sequence both commences and terminates at or near the head portion of the word line corresponding to the row.

43 Claims, 7 Drawing Sheets

MEMORY DEVICE WITH RAPID WORD LINE SWITCH

FIELD OF THE INVENTION

The present invention relates to memory devices comprising an array of cells arranged into bit lines and word lines, and in particular to a memory device that supports fast switching between word lines.

BACKGROUND OF THE INVENTION

Figure 1:
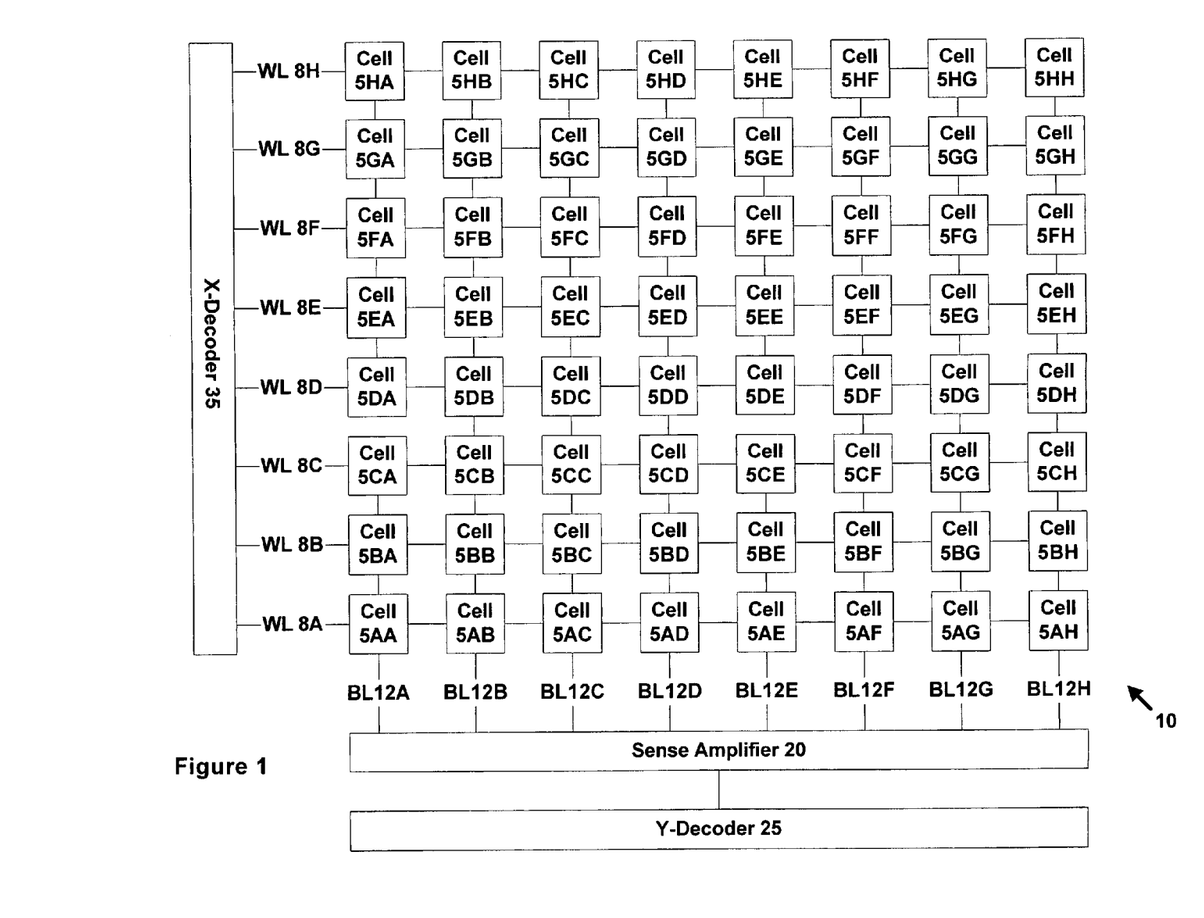
FIG. 1 is a schematic depiction of a known memory device.

FIG. 1 is a schematic representation of a typical memory device 10. The memory device 10 comprises an array of cells 5AA, 5BB, 5BA, etc. Each cell is used to store one bit of data. Each row of cells in the array is linked by a word line 8A, 8B, etc., while each column of cells in the array is linked by a bit line, 12A, 12B, 12C, etc. Any given cell can therefore be uniquely specified by a combination of the appropriate word line 8 and bit line 12. For example, as shown in FIG. 1, cell 5EF can be accessed by the combination of word line 8E and bit line 12F. An X-decoder 35 (also referred to as a row decoder) is used to select a word line 8, while a Y-decoder 25 (also referred to as a column decoder) is used to select a bit line 12, both dependent upon the specified address of a memory operation.

The memory device 10 further includes a sense amplifier 20 connected to each bit line. The sense amplifier is used to read data from or write data to a desired memory cell 5, in accordance with the selected word line 8 and bit line 12. Note that although sense amplifier 20 is shown in FIG. 1 as a single block, it may be implemented as a separate sense amplifier per bit line.

The memory device 10 of FIG. 1 comprises an 8×8 cell storage array, but it will be appreciated that most commercial memory devices incorporate a much larger number of cells. In addition, the number of rows of cells in the array will often be different from the number of columns.

The implementation of an individual memory cell 5 within memory device 10 depends upon the particular type of memory device. For example, in static random access memory (SRAM), each memory cell 5 may comprise a pair of cross-coupled inverters. In dynamic random access memory (DRAM) each cell may comprise a single access transistor and storage capacitor. Other forms of memory device, such as read only memory (ROM) and non-volatile storage (e.g. flash memory) are known in the art, and have a corresponding form of memory cell 5. Memory device 10 is generally formed from a semiconductor material, although an analogous architecture could potentially also be used with other materials, such as organic polymers.

A memory access operation for memory device 10 involves asserting a word line 8 and a bit line 12 corresponding to the cell 5 that is desired to be accessed. The word line and bit line are de-asserted when the memory operation to the desired cell has completed. Note that the precise timing of the assertion and de-assertion of the word line 8 and bit line 12 depends upon the type of memory cell 5, and may not occur simultaneously. For example, a word line for a cell may be asserted before the corresponding bit line. Once the memory operation for a first cell has completed, and the word line and bit line have been de-asserted, a second memory cell can now be accessed by asserting a different word line and bit line as appropriate for the second memory cell.

The X-decoder 35 is used to assert and to de-assert a word line 8, and the Y-decoder 25 is used to assert and to de-assert a bit line 12. However, it can take a significant time for the assertion of a word line to propagate through the array. For example, if X-decoder 35 asserts word line 8F, then cells at the head of the word line (i.e. relatively near to X-decoder 35, such as cell 5FA) are turned on sooner than cells at the tail of the word line (i.e. relatively far from X-decoder 35, such as cell 5FH). There is a similar propagation delay associated with de-asserting a word line 8. Accordingly, there is a skew in timing across a word line 8 from the bit lines 12 at the head of the word line to the bit lines at the tail of the word line.

Two very important operating characteristics of a memory device are its storage capacity and its speed of operation. One limitation on the speed of a memory device is the time taken to switch from one word line to another—in other words, the time taken to de-assert a word line for a first memory cell, and then to assert a word line for a second memory cell. For example, in SRAM, the timing of a write operation is dominated by this word line delay.

A major component in the word line delay is the propagation time or skew along the length of the word line. One way to reduce the word line delay is therefore to limit the number of columns (bit lines) in a memory device array, since the fewer cells there are on a word line, the more quickly the word line switch will complete. However, restricting the length of a word line by reducing the number of cells limits the capacity of the memory device 10.

Some memory devices have tried to combat the word line delay problem by having multiple arrays in the storage device. Such devices can be considered as adding an extra dimension to the storage device, in that any given cell is now specified by a combination of bit, word, and also array (rather than just by bit and word as for the device 10 of FIG. 1). This then allows a memory device to have increased capacity without increasing the length of the word line, thereby preserving memory access speed. However, having multiple arrays in this fashion significantly increases the cost and complexity of a memory device compared to the simple array shown in FIG. 1.

US 2003/0210583 describes a hybrid memory array having multiple row decoders associated with just a single column decoder. The use of multiple row decoders allows the use of shorter word lines—i.e. each memory cell is relatively close to the head of its respective word line (segment). Although this approach can be regarded as simpler than having multiple separate memory arrays, in that now there is only a single column decoder, the architecture is again more complicated and costly than the simple array shown in FIG. 1.

US 2004/0003195 describes a memory device having a small capacity high-speed random access memory and a large capacity low-speed random access memory. It is assumed that a block of data corresponding to one or more whole words (for example a page of memory) is to be stored in such a device. A first, relatively small portion of the data is stored in the small capacity high-speed memory array, while the remaining (larger) portion is stored in the large capacity low-speed memory array. When this data is read, both memory arrays are accessed at the same time. The first portion of the data is available quickly from the high-speed small capacity memory, and by the time that this first portion of the data has been read, the remaining portion of the data is now available from the large capacity, low-speed device. Although such an approach can help to compensate for word line delay, the use of two different memory arrays once again increases the cost and complexity of the device compared to the simple array of FIG. 1.

Figure 2:
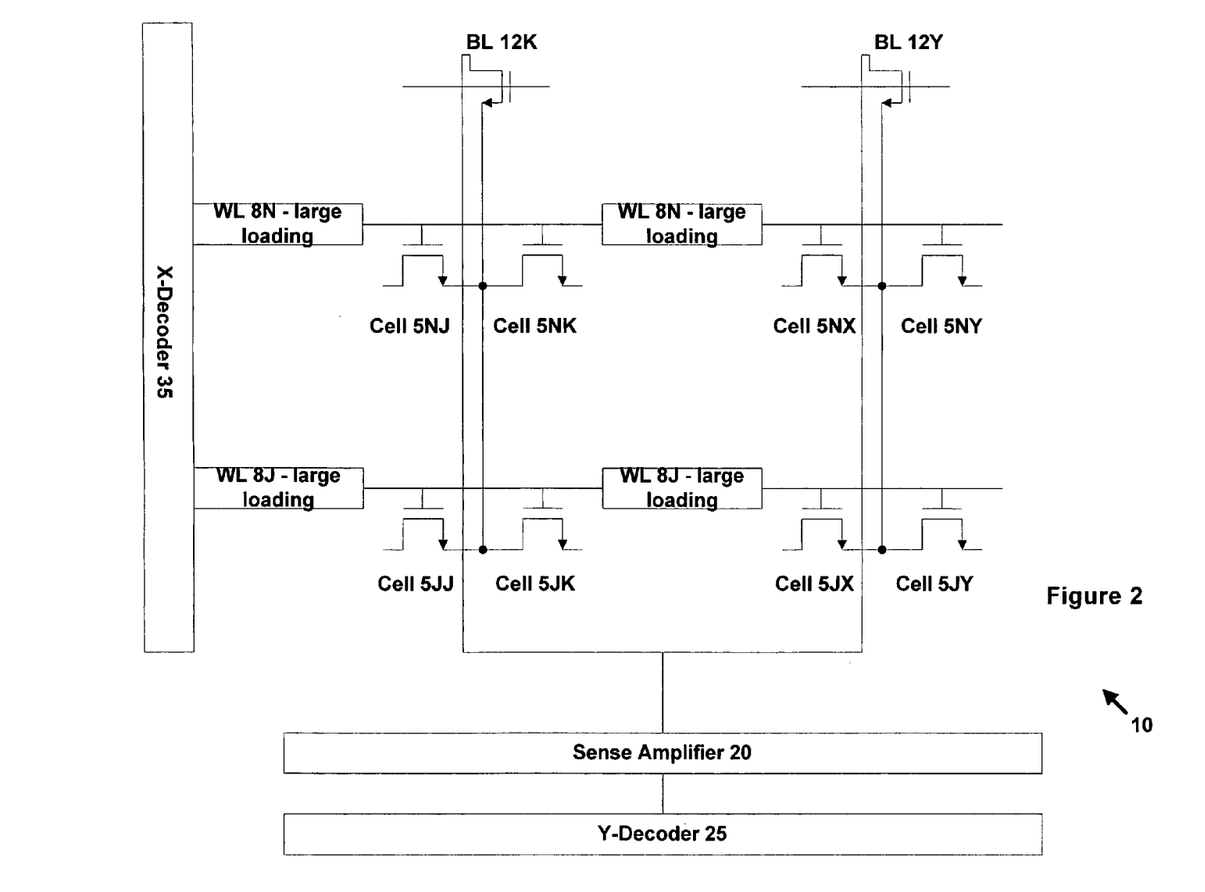
FIG. 2 is a more detailed depiction of certain components from the memory device of FIG. 1.
Figure 3:
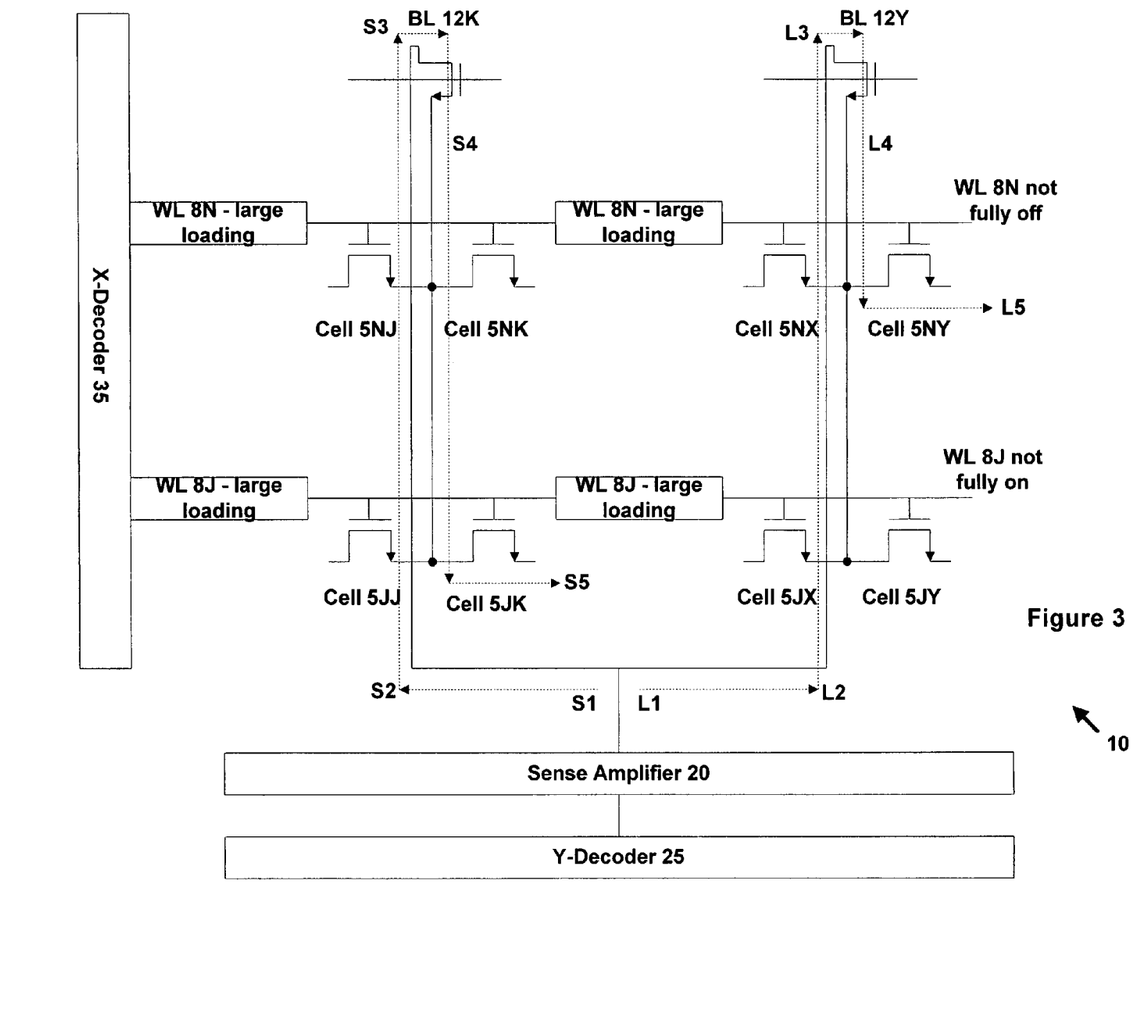
FIG. 3 is a schematic diagram of sense and leakage paths in the memory device of FIG. 2.

FIGS. 2 and 3 illustrate a problem that can arise from the skewed timing of a word line switch such as described above. In particular, the problem may arise if the switching between word lines does not fully allow time for a word line assertion or de-assertion signal to propagate along the full length of the word line.

FIG. 2 depicts two (arbitrary) word lines 8N, 8J and two (arbitrary) bit lines 12K and 12Y, plus associated memory cells 5NY, 5NX, 5NK, 5NJ, 5JY, 5JX, 5JK, and 5JJ. Note that for clarity, the remaining bit lines, word lines, and memory cells of device 10 are omitted from FIG. 2. It is assumed that there are a relatively large number of bit lines between bit line 12K and X-decoder 35, and further a relatively large number of bit lines between bit line 12K and bit line 12Y. Hence there may be a significant timing skew between the word line signal from X-decoder 35 and the word line signal at bit line 12K, and a further significant timing skew between the word line signal at bit line 12K and the word line signal at bit line 12Y.

We assume that device 10 has just finished accessing memory cell 5NY and now wants to access memory cell 5JK. This involves de-asserting word line 8N and asserting word line 8J. FIG. 3 illustrates the sense path for cell 5JK once word line 8J is asserted, as shown by the dotted arrows denoted S1, S2, S3, S4, and S5. If cell 5JK is accessed before word line 8N has been fully de-asserted at the previously accessed cell 5NY, then a leak path exists, as shown in FIG. 3 by the dotted arrows L1, L2, L3, L4 and L5 (corresponding to the previous sense path for cell 5NY). This leakage can interfere with or mask the signal from/to the cell 5JK that is now being accessed.

It will be appreciated therefore that word line switching delays in memory devices reduce memory access speed, and can also lead to the risk of leakage. However, previous attempts to combat such problems have generally required increased complexity and cost of the memory device.

SUMMARY OF THE INVENTION

Accordingly, one embodiment of the invention provides a memory device comprising an array of storage cells and multiple words lines, wherein each word line corresponds to a row in the array of storage cells. The memory device further comprises a row decoder attached to the multiple word lines. The row decoder is operable to assert and to de-assert individual ones of the multiple word lines. Each of the multiple word lines has a head portion adjacent to where the word line is attached to the row decoder. The memory device further comprises multiple bit lines, wherein each bit line corresponds to a column in the array of storage cells. The memory device supports a column decode sequence for accessing multiple storage cells within a row of the array, wherein the row corresponds to a word line. In one particular embodiment of the invention, the column decode sequence both commences and terminates at or near the head portion of the word line. In another particular embodiment of the invention, the column decode sequence commences in a direction away from the head portion of the word line, and terminates in a direction towards the head portion of the word line. Such decode sequences help to reduce word line switching time, and in particular allow a storage cell to be accessed before a word line assertion and/or de-assertion signal has propagated fully down the relevant word line.

In one particular embodiment, each of the multiple word lines has a tail portion opposite to the head portion, remote from where the word line is attached to the row decoder. The row decoder performs a word line switch from a first word line to a second word line by asserting the second word line before the first word line is de-asserted at the tail portion of the first word line. This helps to support a faster word line switch, and hence more rapid memory access operations. In one particular embodiment, the faster word line switch is achieved by activating a column decode sequence to access at least one of the multiple storage cells at or near the head portion of the second word line before the tail portion of the first word line is de-asserted. The storage cell at or near the head portion of the second word line may also be accessed before the tail portion of the second word line is asserted.

In one particular embodiment, the column decode sequence includes selecting first alternate memory cells moving away from the head of the word line and second alternate memory cells moving towards the head of the word line. The first alternate memory cells and second alternate memory cells interleave to comprise all of the word line. A wide range of other decode sequences could also be used as will be apparent to the skilled person. For example, a decode sequence could be based on alternate pairs of memory cells, rather than alternate individual memory cells.

Note also that in some circumstances, the multiple storage cells may correspond to only a portion of a row or word line. In such circumstances, the column decode sequence will generally commence at a first cell and terminate at a second cell, where the first and second cells are nearer to the head portion of the word line than most other cells in the row portion. This again helps to reduce timings for word line switching, even if only a portion of a word line is to be accessed.

In one particular embodiment, the memory device further comprises a column decoder attached to the multiple bit lines. The column decode sequence is implemented by the column decoder. The column decoder may also include suitable buffering to map between the logical (bit) ordering of the memory cells in a word, and the decode sequence. This ensures that the particular decode sequence adopted within the memory device is transparent to other devices (such as a processor) that might interact with the memory device.

The memory device may comprise non-volatile storage such as flash memory, dynamic random access memory (DRAM), or any other similar memory device, such as static random access memory (SRAM), read only memory (ROM), and so on.

Another embodiment of the invention provides a memory device comprising: an array of storage cells; multiple words lines, each corresponding to a row in the array of storage cells; and a row decoder attached to the multiple word lines. The row decoder is operable to assert and to de-assert individual ones of the multiple word lines. Each of the multiple word lines has a head portion adjacent to where the word line is attached to the row decoder and a tail portion opposite to the head portion (remote from where the word line is attached to the row decoder). The row decoder performs a word line switch from a first word line to a second word line by asserting the second word line before the first word line is de-asserted at the tail portion of the first word line.

In one particular embodiment, a column decode sequence is activated to access at least one of multiple storage cells at or near the head portion of the second word line before the first word line is de-asserted at the tail portion of the first word line. In other words, the at least one storage cell in the second word line may be accessed before the first word line is fully off at its tail end and/or the second word line is fully on at its tail end. This helps to support quicker word line switching, by starting to access a memory cell in the second word line without waiting for the word line de-assertion signal to propagate fully down the first word line, and/or for the word line assertion signal to propagate fully down the second word line.

Another embodiment of the invention provides a method of operating a memory device. The method includes providing an array of storage cells, multiple words lines, each word line corresponding to a row in the array of storage cells, and a row decoder attached to the multiple word lines. Each of the multiple word lines has a head portion adjacent to where the word line is attached to the row decoder and a tail portion opposite to the head portion remote from where the word line is attached to the row decoder. The method further includes performing a word line switch from a first word line to a second word line by asserting the second word line and by de-asserting the first word line. The word line switch is timed so that the head portion of the second word line is fully on before the tail portion of the first word line is fully off in order to help minimise the delay of word line switching. In one particular embodiment, a column decode sequence is activated to access at least one of multiple storage cells at or near the head portion of the second word line before the first word line is fully off at the tail portion of the first word line.

Another embodiment of the invention provides a method of operating a memory device. The method includes providing an array of storage cells, multiple words lines, each corresponding to a row in the array of storage cells, multiple bit lines, and a row decoder attached to the multiple word lines. Each of the multiple word lines has a head portion adjacent to where the word line is attached to the row decoder, and each bit line corresponds to a column in the array of storage cells. The method further includes accessing multiple storage cells within a row of the array in accordance with a column decode sequence, the row corresponding to a word line. In one particular embodiment, the column decode sequence both commences and terminates at or near the head portion of the word line. In another particular embodiment, the column decode sequence commences in a direction away from the head portion of the word line, and terminates in a direction towards the head portion of the word line.

It will be appreciated that the method embodiments of the invention may utilise and benefit from the same particular features as described above in relation to the apparatus embodiments.

BRIEF DESCRIPTION OF THE DRAWINGS

One or more embodiments of the invention will now be described in detail by way of example only with reference to the following drawings.

DETAILED DESCRIPTION

Figure 4:
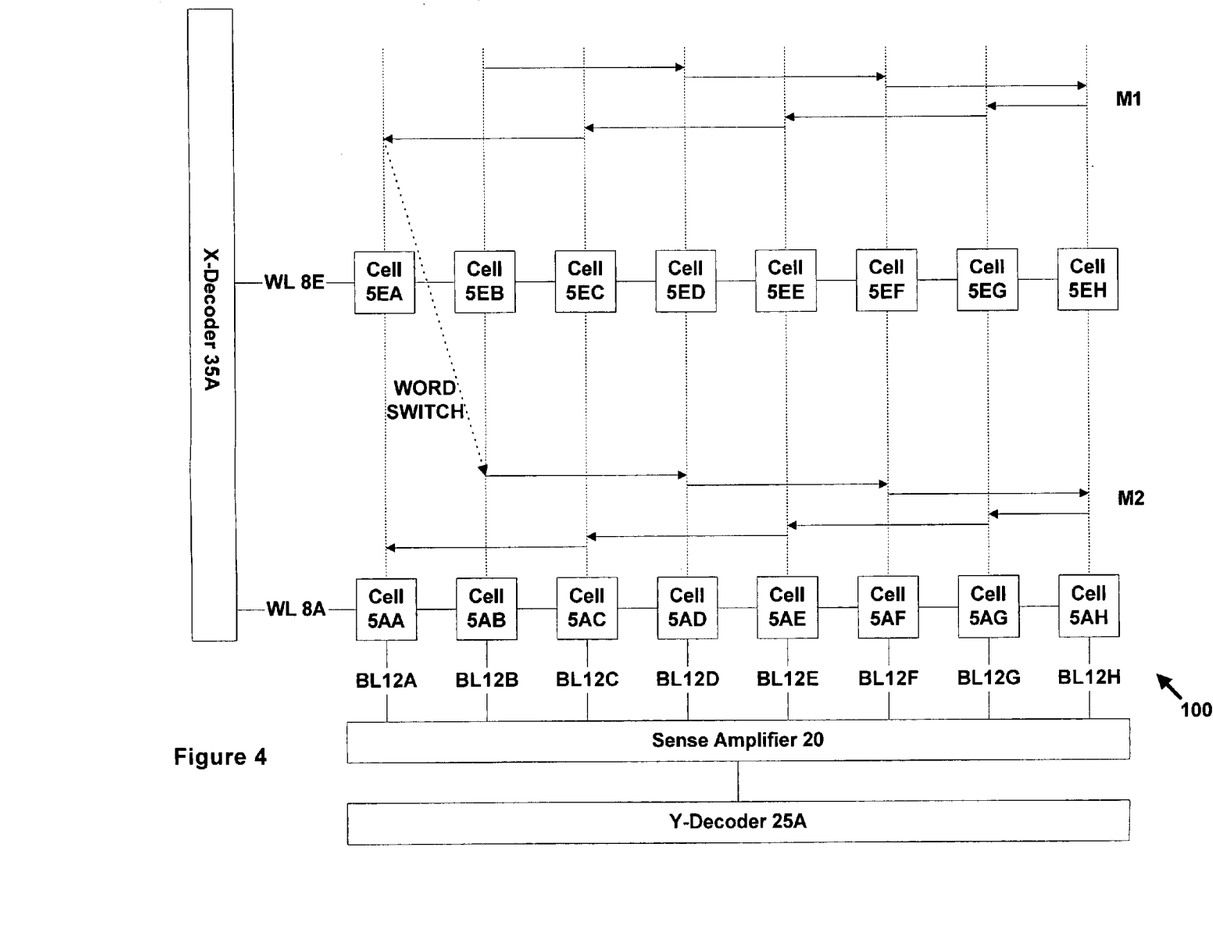
FIG. 4 is a schematic depiction of part of a memory device and an associated decode sequence in accordance with one embodiment of the invention.

FIG. 4 illustrates a memory device 100 in accordance with one embodiment of the invention. (Note that for reasons of clarity, FIG. 4 omits certain word lines and certain cells). The components of memory device 100 are generally similar to those of memory device 10, as described in relation to FIG. 1, except that Y-decoder 25A has been modified (compared to Y-decoder 25 of FIG. 1) to impose a new decode sequence for a word. The decode sequence represents the order in which different cells 5 within the same word line 8 are accessed, normally in order to read or write every cell (bit) in the word (i.e. the complete word). In addition, the timing of word line switching within X-decoder 35A may be different (compared to X-decoder 35 in FIG. 1), as will be explained in more detail below.

The new decode sequence is illustrated in FIG. 4, first in respect of word line 8E, and then in respect of word line 8A. Each memory cell 5 within the relevant word line is accessed in accordance with the decode sequence encoded into Y-decoder 25A. For word line 8E, which is the first word line to be accessed, the decode sequence starts at cell 5EB, and then progresses to cell 5ED, cell 5EF, cell 5EH, cell 5EG, cell 5EE, cell 5EC, and terminates at cell 5EA. This decode sequence is also indicated schematically in FIG. 4 by the set of arrows denoted M1 (shown above the word line).

It is assumed that we now have a switch from word line 8E to word line 8A, where the same decode sequence is executed. Accordingly, the cells of word line 8A are accessed in the order: cell 5AB, cell 5AD, cell 5AF, cell 5AH, cell 5AG, cell 5AE, cell 5AC, and cell 5AA. This decode sequence corresponds to the set of arrows denoted by M2 in FIG. 4.

It will be appreciated that the decode sequence M1, M2 shown in FIG. 4 both starts and terminates near the head of the relevant word line 8, i.e. at a bit line which is separated by zero or only a relatively few bit lines from the X-decoder 35A. Consequently, the word line skew or propagation delay associated with the cells at which the decode sequence both commences and terminates is relatively small (compared to the delay at the tail end of the word line, such as at cell 5EH).

Figure 5:
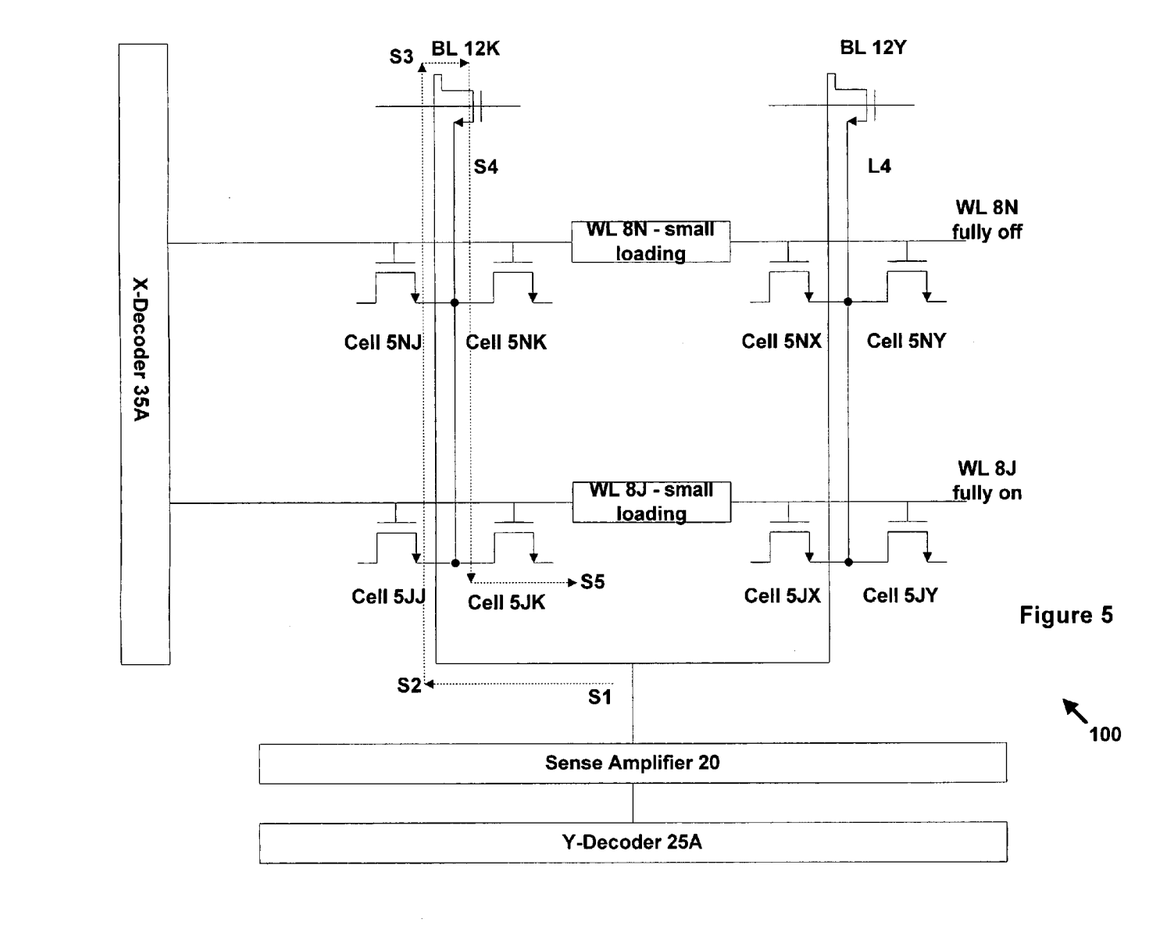
FIG. 5 is a more detailed depiction of certain components from the memory device of FIG. 4 and associated sense path in accordance with one embodiment of the invention.

FIG. 5 illustrates one benefit of using the decode sequence shown in FIG. 4. The general architecture in FIG. 5 is the same as illustrated in FIGS. 2 and 3, and it is again assumed that a memory operation firstly accesses cell 5NY, and subsequently accesses cell 5JK. However, as shown in FIG. 5, it is now assumed that cell 5NY and cell 5JK are both at or near to the head of their respective word lines 8N, 8J, and that cell 5NY represents the end of the decode sequence for word line 8N. Consequently, when word line switching is performed from word line 8N to word line 8J, after cell 5NY has been accessed, the de-assertion of word line 8N at bit line 12Y (corresponding to cell 5NY) occurs relatively quickly, because cell 5NY is near the head of word line 8N, close to X-decoder 35A. As a result, word line 8J can be asserted for the word switch shortly after word line 8N has been de-asserted, with the certainty that word line 8N is fully off in the vicinity of the most recently accessed cell on word line 8N (i.e. cell 5NY), even if the status at the tail end of the word line 8N may be less certain due to the timing skew across word line 8N.

It is assumed that according to the specified decode sequence, cell 5JK is now the first cell in word line 8J to be accessed. Because cell 5JK is near the head of word line 8J, the assertion of word line 8J occurs relatively quickly for cell 5JK compared to cells that are located at the tail end of the word line 8J. Consequently, word line 8J is fully on at an early stage in the vicinity of cell 5JK, as shown in FIG. 5, thereby allowing rapid access to cell 5JK following the word line switch. This helps to minimise the delay between asserting word line 8J and then asserting bit line 12K.

The decode sequence and word line switching procedure of FIGS. 4 and 5 therefore imply that when that cell 5JK is accessed, word line 8N from the previously accessed word line is fully off in the vicinity of cell 5NY (the previously accessed cell). Conversely, word line 8J of the newly accessed word line is fully on in the vicinity of cell 5JK when bit line 12K is activated. Consequently, there is no leakage from cell 5NY to interfere with the sense signal from cell 5JK indicated by dotted arrows S1, S2, S3, S4, S5, which ensures better discrimination of the signal to/from sense amplifier 20.

The decode sequence of FIG. 4 both commences and terminates at or near the head of the relevant word line. It will also be appreciated that the column decode sequence of FIG. 4 commences by moving generally in a direction away from the head of the word line, and terminates by moving in a direction generally towards the head of the word line, thereby implying a change of direction during the decode sequence. (This is to be contrasted with a conventional decode sequence that normally moves in a constant direction, such as away from the head of the word line).

The column decode sequence of FIG. 4 helps to minimise the word line switching time from memory device 100 as implemented within X-decoder 35A. For example, compared to a simple linear decode sequence (such as from cell 5EA through to cell 5EH, or vice versa), the word line switching time for the decode sequence of FIG. 4 can be reduced by up to approximately the propagation (skew) time for the word line signal to travel from the head to the tail of the word line. This is because the present approach avoids having to wait for the word line de-assertion signal to travel to the tail end of the word line being de-asserted before asserting the word line (and bit line) for the next cell to be accessed. This is because it is known that the most recently accessed cell in the word line being de-asserted will be at or near the head of the word line (rather than at the tail of the word line). It will be appreciated that the timing of bit line switching can similarly be controlled to support the above operations—i.e. the decode sequence for the new word line can commence one the new word line is on at the head of the word line, but before the tail of the new word line may be fully on.

Figure 6:
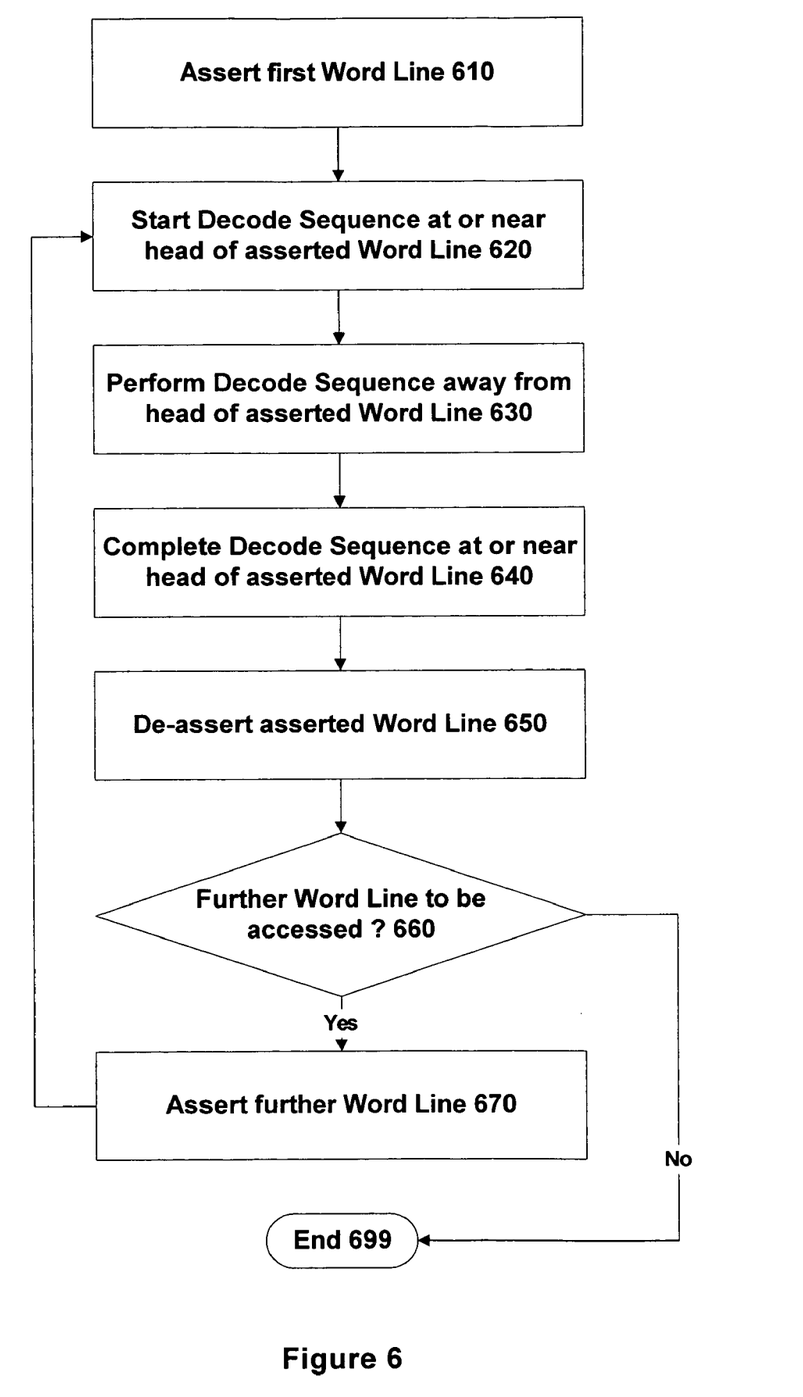
FIG. 6 is a flowchart representing a memory access operation for the memory device of FIG. 4 in accordance with one embodiment of the invention.

FIG. 6 is a flowchart illustrating a method for accessing data within memory device 100 in accordance with one embodiment of the invention. Processing commences with a first word line being asserted (610). The decode sequence of the word line now commences by asserting a bit line 12 at or near the head of the asserted word line (620). The decode sequence continues by accessing memory cells in the middle and at the tail of the asserted word line in some appropriate order as specified by the decode sequence (630). The decode sequence then completes at a cell which is once again at or near the head of the asserted word line (640).

After the decode sequence has completed, the asserted word line is now de-asserted (650), and a determination is made as to whether or not a further word line is to be accessed (660). If so, a word line switch is performed, and the new word line is asserted (670). We can then return to the processing of operation 620 in order to perform the decode sequence on the newly asserted word line. Alternatively, if there is no new word line to access at operation 660, processing terminates (699).

Figure 7:
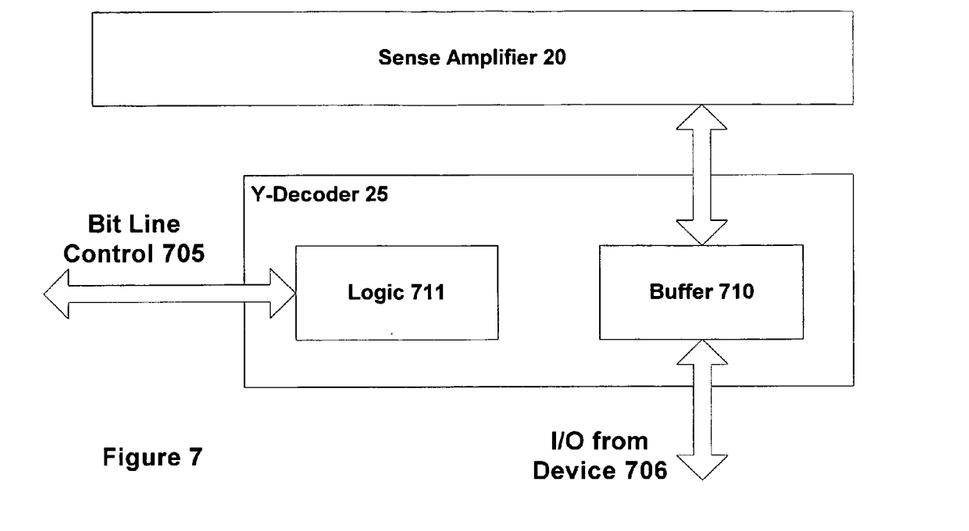
FIG. 7 is a simplified schematic representation of a known column decoder.

FIG. 7 is a schematic illustration of a known Y-decoder 25, such as for use in the memory device 10 of FIG. 1. The Y-decoder includes logic 711 for implementing a column decode sequence using bit line control 705. In general, column decode sequence represents a linear increase of bit line (or vice versa), and so can be readily computed by logic 711. Y-decode 25 further includes buffer 710 for storing data being read from or written onto memory device 10. Buffer 710 communicates with the array of cells 5 via sense amplifier 706, and communicates with an external user of memory device 10 via I/O connection 706. For a linear column decode sequence, buffer 710 may be implemented by a shift register.

Figure 7A:
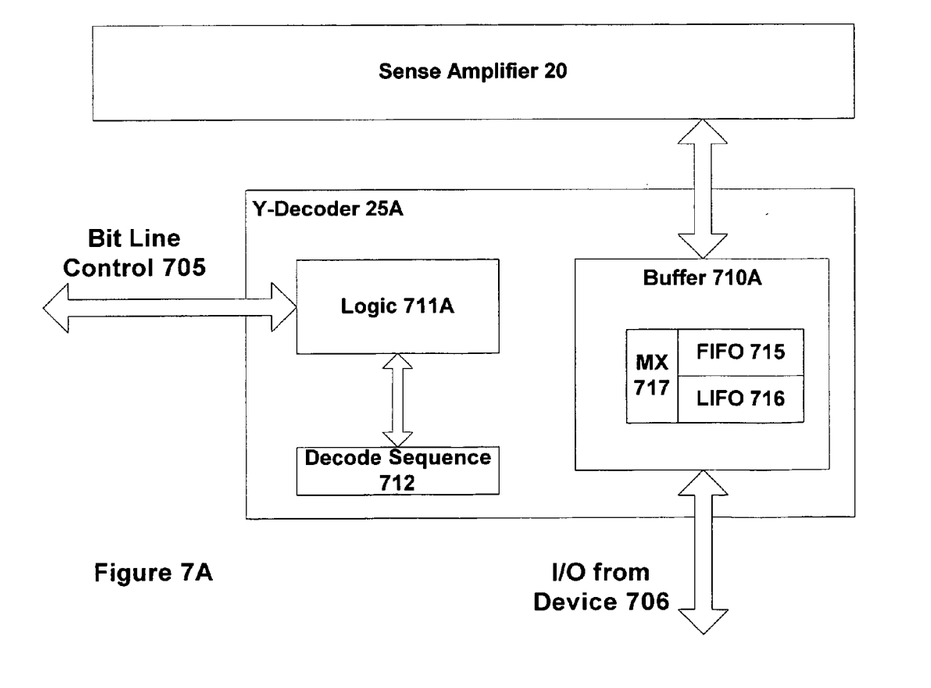
FIG. 7A is a simplified schematic representation of a column decoder such as for use in the memory device of FIG. 4 in accordance with one embodiment of the invention.

FIG. 7A is a schematic illustration of a Y-decoder 25A, such as for use in the memory device 100 of FIG. 4, in accordance with one embodiment of the invention. Y-decoder 25A is generally the same as Y-decoder 25 of FIG. 7, except for changes to support a more complex column decode sequence, such as shown in FIG. 4. In particular, Y-decoder 25A includes a stored column decode sequence 712, which is accessed by logic 711A in performing bit line control. The stored column decode sequence 712 may be saved in ROM or any other suitable memory component. Alternatively, rather than having a stored column decode sequence 712, logic 711A may include some algorithm to determine the new column decode sequence. For example, the decode sequence of M1 shown in FIG. 4 can be numerically represented as 1, 3, 5, 7, 6, 4, 2, 0 (assuming bit line 12A represents 0, bit line 12B represents 1, and so on). This numerical sequence can be specified as:

(a) start at position 1;
(b) increment by two bit line positions;
(c) if the position is greater than 7, subtract from 15.

Such an algorithm can be readily incorporated into logic 711A, and also generalised to any number of cells in a word line or desired column decode sequence.

FIG. 7A also shows that buffer 710A is modified (compared to buffer 710 of FIG. 7) to accommodate the more complex column decode sequence of Y-decoder 25A. This arises from the fact that the column decode sequence no longer corresponds to the logical sequence of bits within a word (from least significant bit to most significant bit, or vice versa). One possibility would be to implement buffer 710A as a one-dimensional random access memory. This would allow data read from cells 5 in the column decode sequence to be inserted into buffer 710A in their logical position within the word. For example, for the column decode sequence of FIG. 4, cell 5EB would be written into bit position 1, cell 5ED would be written into bit position 3, cell 5EF would be written into bit position 5, and so on, until the entire word had been written into buffer 710 in its correct order. Writing from buffer 710 into the cells would then be performed in the converse manner.

FIG. 7A illustrates an alternative implementation for buffer 710A that is suited to the column decode sequence of FIG. 4. This shows buffer 710A implemented as two shift registers, one operated as a first-in first-out (FIFO) queue 715, and the other as a last-in first-out (LIFO) queue 716. Cells 5EB, 5ED, 5EF and 5EH are read into FIFO 715, and cells 5EG, 5EE, 5EC and 5EA are read into LIFO 716 (in access order). Multiplexer (MX) 717 can then be used to read out from LIFO 716 and FIFO 715 in turn, to allow the logical order of the word from word line 8E to be restored.

It will be appreciated that the implementation of Y-decoder 25A shown in FIG. 7A is schematic only. The skilled person will be aware of many other possible implementations to support the decode sequence of FIG. 4.

It will also be appreciated that the decode sequence shown in FIG. 4 is just one of many possible decode sequences that both commence and terminate near the head of the word line 8. For example, another such decode sequence comprises bit line 12A, bit line 12C, bit line 12E, bit line 12G, bit line 12H, bit line 12F, bit line 12D, and then bit line 12B. Another possible decode sequence comprises bit line 12A, bit line 12D, bit line 12G, bit line 12H, bit line 12F, bit line 12E, bit line 12C, bit line 12B. The skilled person will easily be able to create other similar decode sequences to support rapid word line switching. In addition, the skilled person will easily be able to generalise such sequences to word lines having more (or less) than 8 bit lines.

It will also be noted that a decode sequence may not necessarily access every bit within the word line, depending on the particular memory access operation to be performed. For example, a memory access operation may only access the first half of the word, which in the embodiment of FIG. 4 might be accomplished by the decode sequence of bit line 12A, bit line 12C, bit line 12D and finally bit line 12B. As another example, a memory access operation may only access the second half of the word, which in the embodiment of FIG. 4 might be accomplished by the decode sequence of bit line 12E, bit line 12G, bit line 12H and finally bit line 12F.

In conclusion, although a variety of particular embodiments have been described in detail herein, it will be appreciated that this is by way of illustration only. The skilled person will be aware of many further potential modifications and adaptations that fall within the scope of the claims and their equivalents.

The invention claimed is:

1. A memory device comprising:
an array of storage cells;
multiple words lines, wherein each word line corresponds to a row in the array of storage cells;
a row decoder attached to said multiple word lines, wherein said row decoder is operable to assert and to de-assert individual ones of said multiple word lines, and wherein each of said multiple word lines has a head portion adjacent to where the word line is attached to the row decoder; and
multiple bit lines, wherein each bit line corresponds to a column in the array of storage cells;
wherein said memory device supports a column decode sequence for accessing multiple storage cells within a row of the array, said row corresponding to a word line, wherein said column decode sequence both commences and terminates at or near the head portion of said word line.

2. The memory device of claim 1, wherein each of said multiple word lines has a tail portion opposite to the head portion, remote from where the word line is attached to the row decoder, and wherein said row decoder performs a word line switch from a first word line to a second word line by asserting the second word line before the tail portion of the first word line is de-asserted.

3. The memory device of claim 2, wherein said column decode sequence is activated to access at least one of said multiple storage cells at or near the head portion of said second word line before the tail portion of the first word line is de-asserted.

4. The memory device of claim 1, wherein said column decode sequence includes selecting first alternate memory cells moving away from the head of the word line and second alternate memory cells moving towards the head of the word line, wherein said first alternate memory cells and second alternate memory cells interleave to comprise all of said word line.

5. The memory device of claim 1, further comprising a column decoder attached to said multiple bit lines, wherein said column decode sequence is implemented by said column decoder.

6. The memory device of claim 5, wherein said row decoder is operable to perform a word line switch between a first word line and a second word line, wherein said second word line is asserted before said first word line is de-asserted at storage cells not in the head portion of the first word line, and wherein said column decoder is operable to initiate said column decode sequence before said second word line is asserted at storage cells not in the head portion of the second word line.

7. The memory device of claim 1, wherein said multiple storage cells correspond to a portion of a row, wherein the column decode sequence commences at a first cell and terminates at a second cell, and wherein said first and second cells are nearer to the head portion of said word line than most other cells in said row portion.

8. The memory device of claim 1, wherein said device comprises non-volatile storage.

9. The memory device of claim 1, wherein said device comprises dynamic random access memory.

10. A memory device comprising:
an array of storage cells;
multiple words lines, wherein each word line corresponds to a row in the array of storage cells;
a row decoder attached to said multiple word lines, wherein said row decoder is operable to assert and to de-assert individual ones of said multiple word lines, and wherein each of said multiple word lines has a head portion adjacent to where the word line is attached to the row decoder; and
multiple bit lines, wherein each bit line corresponds to a column in the array of storage cells;
wherein said memory device supports a column decode sequence for accessing multiple storage cells within a row of the array, said row corresponding to a word line, wherein said column decode sequence commences in a direction away from the head portion of the word line, and terminates in a direction towards the head portion of said word line.

11. The memory device of claim 10, wherein each of said multiple word lines has a tail portion opposite to the head portion, remote from where the word line is attached to the row decoder, and wherein said row decoder performs a word line switch from a first word line to a second word line by asserting the second word line before the tail portion of the first word line is de-asserted.

12. The memory device of claim 11, wherein said column decode sequence is activated to access at least one of said multiple storage cells at or near the head portion of said second word line before the tail portion of the first word line is de-asserted.

13. The memory device of claim 10, wherein said column decode sequence includes selecting first alternate memory cells moving away from the head of the word line and second alternate memory cells moving towards the head of the word line, wherein said first alternate memory cells and second alternate memory cells interleave to comprise all of said word line.

14. The memory device of claim 10, further comprising a column decoder attached to said multiple bit lines, wherein said column decode sequence is implemented by said column decoder.

15. The memory device of claim 14, wherein said row decoder is operable to perform a word line switch between a first word line and a second word line, wherein said second word line is asserted before said first word line is de-asserted at storage cells not in the head portion of the first word line, and wherein said column decoder is operable to initiate said column decode sequence before said second word line is asserted at storage cells not in the head portion of the second word line.

16. The memory device of claim 10, wherein said multiple storage cells correspond to a portion of a row, wherein the column decode sequence commences at a first cell and terminates at a second cell, and wherein said first and second cells are nearer to the head portion of said word line than most other cells in said row portion.

17. The memory device of claim 10, wherein said device comprises non-volatile storage.

18. The memory device of claim 10, wherein said device comprises dynamic random access memory.

19. A memory device comprising:
an array of storage cells;
multiple words lines, wherein each word line corresponds to a row in the array of storage cells; and
a row decoder attached to said multiple word lines, wherein said row decoder is operable to assert and to de-assert individual ones of said multiple word lines, and wherein each of said multiple word lines has a head portion adjacent to where the word line is attached to the row decoder and a tail portion opposite to said head portion remote from where the word line is attached to the row decoder;
wherein said row decoder performs a word line switch from a first word line to a second word line by asserting the second word line before the tail portion of the first word line is de-asserted.

20. The memory device of claim 19, wherein a column decode sequence is activated to access at least one of multiple storage cells at or near the head portion of said second word line before the tail portion of the first word line is de-asserted.

21. The memory device of claim 20, wherein the column decode sequence is activated to access at least one of multiple storage cells at or near the head portion of said second word line before tail portion of the second word line is asserted.

22. The memory device of claim 20, further comprising a column decoder attached to said multiple bit lines, wherein said column decode sequence is implemented by said column decoder.

23. The memory device of claim 19, wherein said memory device supports a column decode sequence for accessing multiple storage cells within a row of the array, said row corresponding to a word line, wherein said column decode sequence commences in a direction away from the head portion of the word line, and terminates in a direction towards the head portion of said word line.

24. The memory device of claim 19, wherein said memory device supports a column decode sequence for accessing multiple storage cells within a row of the array, said row corresponding to a word line, wherein said column decode sequence both commences and terminates at or near the head portion of said word line.

25. The memory device of claim 19, wherein said device comprises non-volatile storage.

26. The memory device of claim 19, wherein said device comprises dynamic random access memory.

27. A method of operating a memory device comprising:
providing an array of storage cells, multiple words lines, each corresponding to a row in the array of storage cells, and a row decoder attached to said multiple word lines, wherein each of said multiple word lines has a head portion adjacent to where the word line is attached to the row decoder and a tail portion opposite to said head portion, remote from where the word line is attached to the row decoder; and
performing a word line switch from a first word line to a second word line by asserting the second word line and by de-asserting the first word line, wherein the head portion of the second word line is fully on before the tail portion of the first word line is fully off.

28. The method of claim 27, further comprising activating a column decode sequence to access at least one of multiple storage cells at or near the head portion of said second word line before the tail portion of the first word line is fully off.

29. The method of claim 27, further comprising activating a column decode sequence to access at least one of multiple storage cells at or near the head portion of said second word line before the tail portion of the second word line is fully on.

30. The method of claim 27, further comprising accessing multiple storage cells within a row of the array in accordance with a column decode sequence, said row corresponding to a word line, wherein said column decode sequence commences in a direction away from the head portion of the word line, and terminates in a direction towards the head portion of said word line.

31. The method of claim 27, further comprising accessing multiple storage cells within a row of the array in accordance with a column decode sequence, said row corresponding to a word line, wherein said column decode sequence both commences and terminates at or near the head portion of said word line.

32. A method of operating a memory device comprising:
providing an array of storage cells, multiple words lines, each corresponding to a row in the array of storage cells, a row decoder attached to said multiple word lines, wherein each of said multiple word lines has a head portion adjacent to where the word line is attached to the row decoder, and multiple bit lines, wherein each bit line corresponds to a column in the array of storage cells; and
accessing multiple storage cells within a row of the array in accordance with a column decode sequence, said row corresponding to a word line, wherein said column decode sequence both commences and terminates at or near the head portion of said word line.

33. The method of claim 32, wherein each of said multiple word lines has a tail portion opposite to the head portion, remote from where the word line is attached to the row decoder, and wherein said row decoder performs a word line switch from a first word line to a second word line by asserting the second word line before the first word line is de-asserted at the tail portion of the first word line.

34. The method of claim 33, wherein said column decode sequence is activated to access at least one of said multiple storage cells at or near the head portion of said second word line before the tail portion of the first word line is de-asserted.

35. The method of claim 33, wherein said column decode sequence is activated to access at least one of said multiple storage cells at or near the head portion of said second word line before the tail portion of the second word line is asserted.

36. The method of claim 33, wherein said column decode sequence includes selecting first alternate memory cells moving away from the head of the word line and second alternate memory cells moving towards the head of the word line, wherein said first alternate memory cells and second alternate memory cells interleave to comprise all of said word line.

37. The method of claim 33, wherein said multiple storage cells correspond to a portion of a row, wherein the column decode sequence commences at a first cell and terminates at a second cell, and wherein said first and second cells are nearer to the head portion of said word line than most other cells in said row portion.

38. A method of operating a memory device comprising:
providing an array of storage cells, multiple words lines, wherein each word line corresponds to a row in the array of storage cells, a row decoder attached to said multiple word lines, wherein each of said multiple word lines has a head portion adjacent to where the word line is attached to the row decoder, and multiple bit lines, wherein each bit line corresponds to a column in the array of storage cells; and
accessing multiple storage cells within a row of the array in accordance with a column decode sequence, said row corresponding to a word line, wherein said column decode sequence commences in a direction away from the head portion of the word line, and terminates in a direction towards the head portion of said word line.

39. The method of claim 38, wherein each of said multiple word lines has a tail portion opposite to the head portion, remote from where the word line is attached to the row decoder, and wherein said row decoder performs a word line switch from a first word line to a second word line by asserting the second word line before the tail portion of the first word line is de-asserted.

40. The method of claim 39, wherein said column decode sequence is activated to access at least one of said multiple storage cells at or near the head portion of said second word line before the tail portion of the first word line is de-asserted.

41. The method of claim 39, wherein said column decode sequence is activated to access at least one of said multiple storage cells at or near the head portion of said second word line before the tail portion of the second word line is asserted.

42. The method of claim 38, wherein said column decode sequence includes selecting first alternate memory cells moving away from the head of the word line and second alternate memory cells moving towards the head of the word line, wherein said first alternate memory cells and second alternate memory cells interleave to comprise all of said word line.

43. The method of claim 38, wherein said multiple storage cells correspond to a portion of a row, wherein the column decode sequence commences at a first cell and terminates at a second cell, and wherein said first and second cells are nearer to the head portion of said word line than most other cells in said row portion.

* * * * *